US007841753B2

(12) United States Patent
Liu

(10) Patent No.: US 7,841,753 B2
(45) Date of Patent: Nov. 30, 2010

(54) LED ILLUMINATION DEVICE AND LIGHT ENGINE THEREOF

(75) Inventor: Tay-Jian Liu, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 65 days.

(21) Appl. No.: 12/406,051

(22) Filed: Mar. 17, 2009

(65) Prior Publication Data

US 2009/0237933 A1 Sep. 24, 2009

(30) Foreign Application Priority Data

Mar. 19, 2008 (CN) ........................ 2008 1 0066124

(51) Int. Cl.
*F21V 29/00* (2006.01)

(52) U.S. Cl. ....................... 362/373; 362/294; 362/800; 362/249.02; 362/249.01

(58) Field of Classification Search ................. 257/706; 362/800, 294, 373, 345, 249.02, 249.01
See application file for complete search history.

(56) References Cited

U.S. PATENT DOCUMENTS 4,729,076 A * 3/1988 Masami et al. .............. 362/235
6,897,486 B2 * 5/2005 Loh ............................ 257/81
6,910,794 B2 * 6/2005 Rice ........................... 362/547
7,438,448 B2 * 10/2008 Chen .......................... 362/373
7,604,380 B2 * 10/2009 Burton et al. ............... 362/294
7,722,217 B2 * 5/2010 Chen ..................... 362/249.02

FOREIGN PATENT DOCUMENTS

CN 2881340 Y 3/2007
CN 200982536 Y 11/2007

* cited by examiner

*Primary Examiner*—Anabel M Ton
(74) *Attorney, Agent, or Firm*—Frank R. Niranjan

(57) ABSTRACT

An LED illumination device includes an optical section at a front end thereof, an electrical section at a rear end thereof, and a heat dissipation section between the optical section and the electrical section. The optical section includes a plurality of LEDs electrically connecting with the electrical section, and a light output housing around the LEDs. The heat dissipation section includes a plurality of L-shaped heat pipes, a heat sink and a mounting seat. Each of the heat pipes includes an evaporation section and a condensation section substantially perpendicular thereto. The condensation sections of the heat pipes are received in the heat sink. The mounting seat attaches to the evaporation sections of the heat pipes. The LEDs thermally connect with evaporation sections via the mounting seat.

20 Claims, 10 Drawing Sheets

LED ILLUMINATION DEVICE AND LIGHT ENGINE THEREOF

BACKGROUND

1. Technical Field

The disclosure generally relates to light emitting diode (LED) illumination devices, and particularly to an LED illumination device with a light engine, which has high heat dissipation efficiency.

2. Description of Related Art

It is well known that LEDs have been widely used in illumination devices to substitute for conventional cold cathode fluorescent lamps (CCFLs) due to high brightness, long lifespan, and wide color range.

For an LED, 80 to 90 percent (%) of the power consumed thereby is converted into thermal energy, and only 10 to 20% of the power consumed by the LED is converted into light. In addition, a plurality of LEDs are generally packaged in a single LED illumination device to obtain the desired illumination. Therefore, for a high brightness LED illumination device, highly efficient heat dissipation is required for timely and adequate removal of the heat generated to avoid brightness, lifespan, and reliability of the LED illumination device being seriously affected. Many widely used heat dissipation devices, such as heat sinks or a combination of heat sink and cooling fan, however, are inadequate to satisfy the heat dissipation requirements of such high brightness LED illumination devices.

What is needed, therefore, is an LED illumination device which overcomes the described limitations.

BRIEF DESCRIPTION OF THE DRAWINGS

Many aspects of the present LED illumination device can be better understood with reference to the following drawings. The components in the drawings are not necessarily drawn to scale, the emphasis instead being placed upon clearly illustrating the principles of the disclosed LED illumination device. Moreover, in the drawings, like reference numerals designate corresponding parts throughout the several views.

DETAILED DESCRIPTION OF THE EMBODIMENTS

Figure 1:
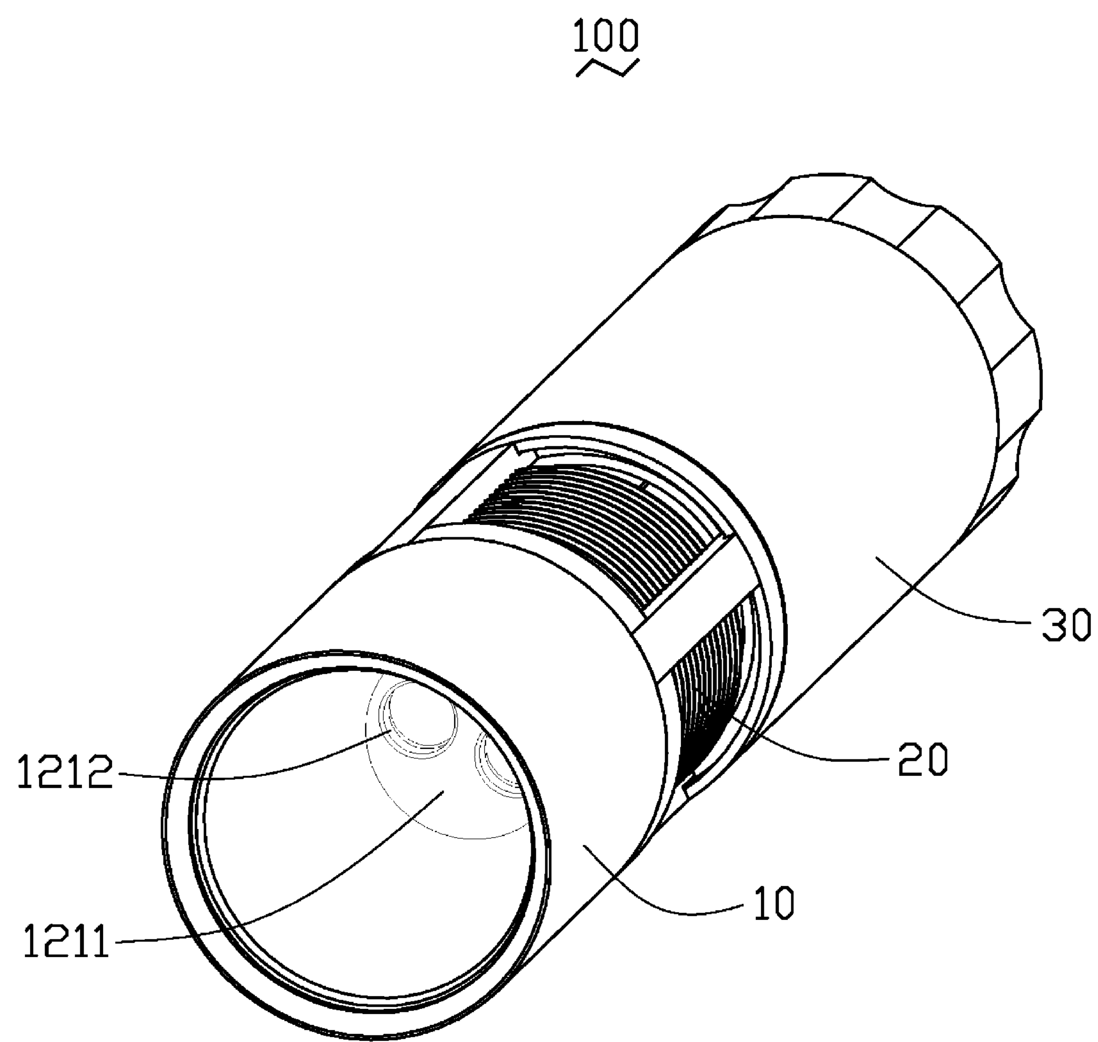
FIG. 1 is an assembled, isometric view of an LED illumination device in accordance with a first embodiment of the disclosure.
Figure 2:
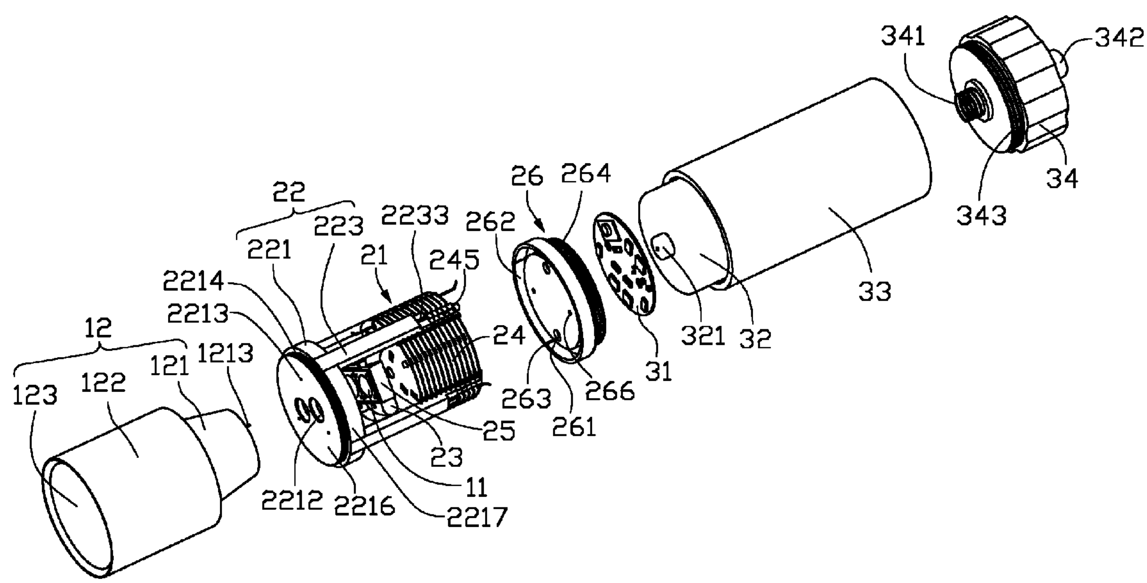
FIG. 2 is an exploded, isometric view of the LED illumination device of FIG. 1.

Referring to FIGS. 1 and 2, an LED illumination device 100 in accordance with a first embodiment of the disclosure is shown. The LED illumination device 100 includes an optical section 10, an electrical section 30, and a heat dissipation section 20 arranged therebetween. The LED illumination device 100 is substantially cylindrical. The optical section 10 is disposed at a front end of the LED illumination device 100, while the electrical section 30 is disposed at a rear end of the LED illumination device 100.

Figure 3:
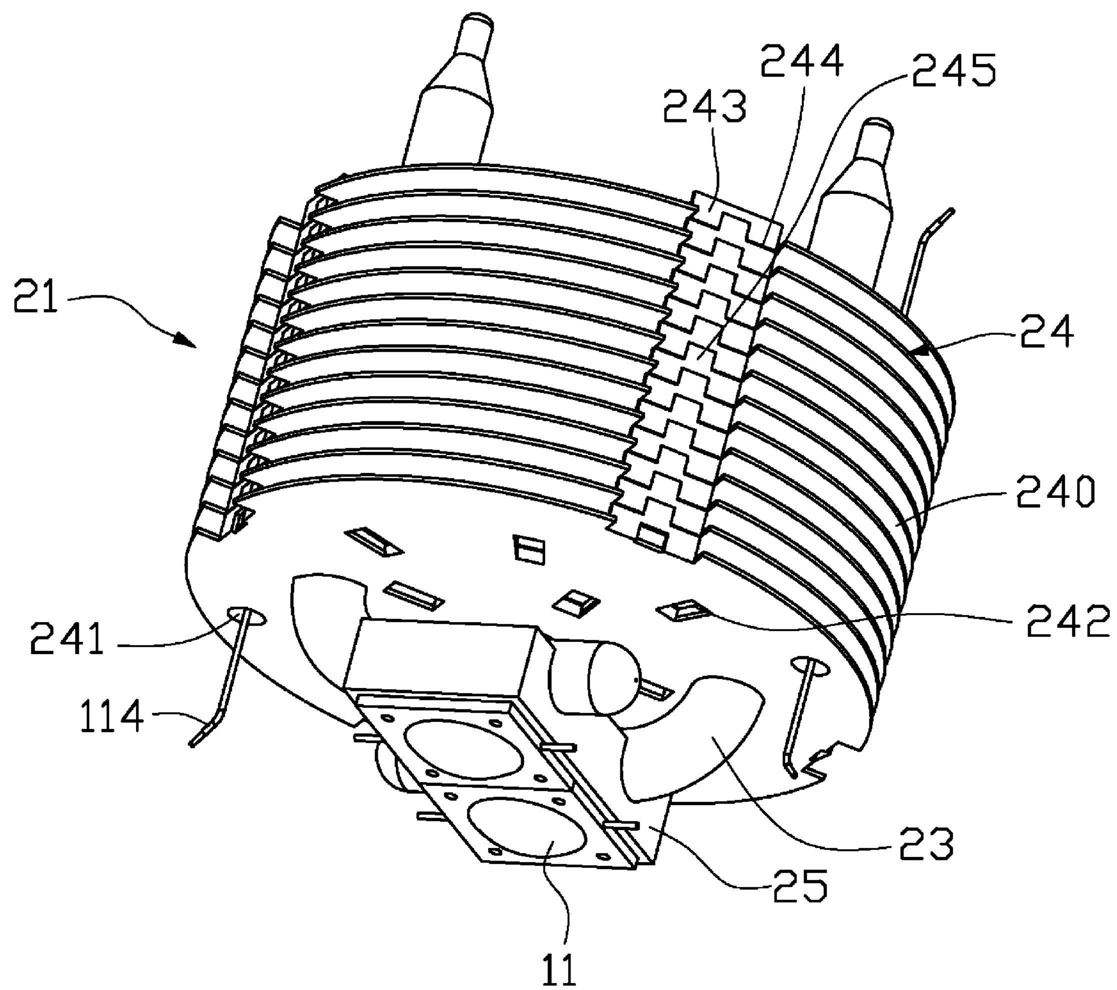
FIG. 3 is an assembled, isometric view showing a light engine of the LED illumination device of FIG. 1.
Figure 4:
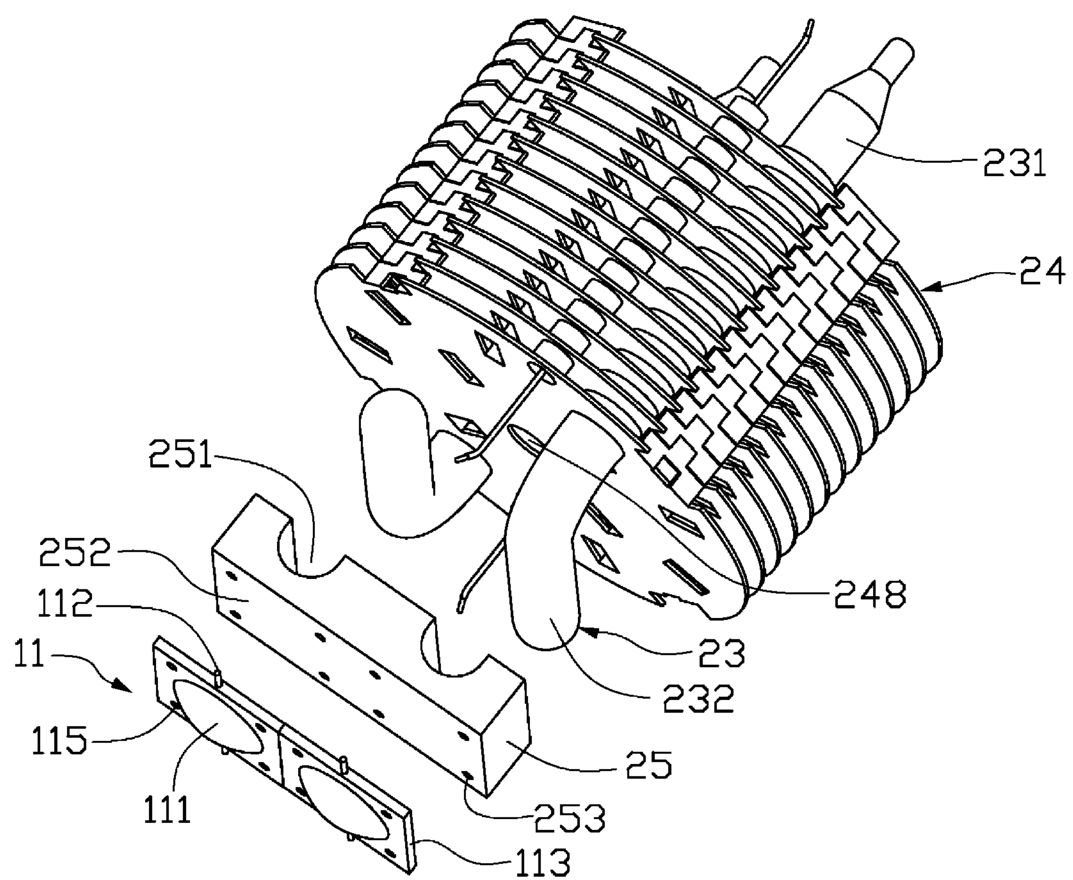
FIG. 4 is an exploded, isometric view of the light engine of FIG. 3.

The optical section 10 includes two LEDs 11 and a light output housing 12 around the LEDs 11. Referring to FIGS. 3 and 4, each of the LEDs 11 includes a substrate 113, an emitter 111 electrically connected with the substrate 113, and a pair of electrodes 112 at opposite sides of the substrate 113. A pair of electric wires 114 are provided to connect respectively to the electrodes 112, electrically connecting the emitter 111 with the electrical section 30. The substrate 113 defines a threaded hole 115 in each corner thereof.

Referring again to FIGS. 1 and 2, the light output housing 12 includes a light reflector 121, a shell 122, and an optical lens 123. The shell 122 is hollow and cylindrical. A rear end of the shell 122 is coupled to the heat dissipation section 20, and a front end of the shell 122 is enclosed by the optical lens 123. The light reflector 121 and the LED 11 are received in the shell 122. The shell 122 provides protection for the LED 11 and the light reflector 121. The light reflector 121 is hollow and a truncated conical shape, and tapers from a front end thereof engaging the front end of the shell 122 towards a rear end thereof adjacent to the heat dissipation section 20. The front end of the light reflector 121 is open, and the rear end is enclosed by a circular plate 1211 (shown in FIG. 1). The circular plate 1211 defines two openings 1212 receiving the emitters 111, respectively, and has a plurality of fixing pins 1213 extending rearward therefrom around the openings 1212. The light reflector 121 has a reflective inner surface, redirecting light emitted from the emitter 111. The light reflector 121 and the optical lens 123 provide illumination characteristics for the emitter 111.

The heat dissipation section 20 includes a heat sink 24, a mounting seat 25, a pair of heat pipes 23 thermally connecting the heat sink 24 with the mounting seat 25, a frame 22 supporting the heat sink 24, and a holder 26 mechanically connecting the heat dissipation section 20 with the electrical section 30.

Referring again to FIGS. 3 and 4, the heat sink 24 includes a stacked plurality of parallel fins 240. Each of the fins 240 defines a plurality of through holes 241, a central air channel 248 in a center thereof, and a plurality of vents 242 around the central air channel 248. The through holes 241 receive the electric wires 114 therein, such that the electric wires 114 electrically connect the emitter 111 with the electrical section 30. The central air channel 248 has an area exceeding that of each vent 242. The vents 242 enable airflow to generate turbulence between the fins 240, and the central air channel 248 guides the airflow towards the LEDs 11. Each of the fins 240 is punched upwardly and outwardly in a plurality of flanges 243 from an outer circumferential surface thereof, and defines a plurality of cutouts 244 respectively adjacent to the flanges 243. Each of the flanges 243 of a bottom fin 240 engages a corresponding flange 243 of a top fin 240, mounting the fins 240 together. The cutouts 244 of the fins 240 align and cooperatively form a plurality of latching grooves 245 at an outer circumferential surface of the heat sink 24.

Each of the heat pipes 23 is substantially L-shaped, including an evaporation section 232 and a condensation section 231 extending upwardly and perpendicularly from one end of the evaporation section 232. The condensation section 231 is inserted into the heat sink 24 from bottom to top, with a free end of the condensation section 231 extending out of the heat sink 24. The evaporation section 232 is generally straight and circular, and mounted in the mounting seat 25.

The mounting seat 25 thermally connects with the substrate 113 of each LED 11. The mounting seat 25 is made of a highly heat conductive metal, such as copper or copper alloy. In this embodiment, the mounting seat 25 is a rectangular block shape, defining two spaced semicircular grooves 251 at a top side thereof. The two grooves 251 receive the two evaporation sections 232 of the two heat pipes 23 therein, respectively, with an outer surface of each evaporation section 232 intimately contacting an inner surface of the mounting seat 25 surrounding each groove 251. A bottom surface 252 of the mounting seat 25 intimately contacts the substrate 113. The mounting seat 25 defines a plurality of threaded holes 253 therein corresponding to the threaded holes 115 of the substrates 113. Fasteners such as screws are utilized to extend through the threaded holes 253, 115 and thereby mount the LEDs 11 on the mounting seat 25. Alternatively, electrical circuits may be directly formed on the bottom surface 252 of the mounting seat 25, with the emitters 111 directly attached to the bottom surface 252 of the mounting seat 25, whereby the substrates 113 can be omitted and a heat resistance between the emitters 111 and the mounting seat 25 reduced.

The LEDs 11, the mounting seat 25, the heat pipes 23 and the heat sink 24 cooperatively form a light engine 21 for the LED illumination device 100.

Referring again to FIGS. 1 and 2, the frame 22 includes a base 221 and a plurality of arms 223 extending backwardly and axially from the base 221. The base 221 is substantially hollow and cylindrical. The base 221 includes a circular plate 2216 and a cylinder 2217 extending backward from an outer periphery of the circular plate 2216. Thus a front end is enclosed, and a rear end of the base 221 is open. The base 221 defines two openings 2212 in a middle of the circular plate 2216, and a plurality of fixing holes 2213 in the circular plate 2216 around the openings 2212. The openings 2212 align with and have the same diameter as the openings 1212 of the light reflector 121, respectively. Each of the emitters 111 extends through the openings 1212, 2212 into the reflector 121 of the light output housing 12. The fixing pins 1213 of the light reflector 121 are inserted into the fixing holes 2213, respectively, mounting the light reflector 121 on the base 221. Meanwhile, the mounting seat 25 and the evaporation section 232 of each heat pipe 23 are received in the base 221. An outer diameter of the front portion of the base 221 is slightly less than an inner diameter of the shell 122 of the light output housing 12. The base 221 forms a thread 2214 at an outer circumferential surface of the front portion thereof, engaging the base 221 with the shell 122. The arms 223 are inserted into the latching grooves 245, respectively. Each of the arms 223 has an orientation pin 2233 at a free end thereof extending axially towards the holder 26.

The holder 26 is cylindrical. The holder 26 defines an annular groove 262, a pair of receiving holes 261, a pair of through holes 266, and a plurality of orientation grooves 263 in a front end thereof. The annular groove 262 aligns with the free ends of the arms 223. The receiving holes 261 align with the free ends of the heat pipes 23, respectively. The through holes 266 communicate the front end with the rear end of the holder 26, and are provided for the electric wires 114 to extend therethrough. The orientation grooves 263 are axially defined in an inner circumferential surface of the holder 26, and communicate with the annular groove 262. The orientation grooves 263 align with the orientation pins 2233 at the free end of the arms 223, respectively. The heat pipes 23, the heat sink 24 and the mounting seat 25 are received in a space cooperatively defined by the base 221, the arms 223 and the holder 26. A diameter of a front portion of the holder 26 slightly exceeds that of a rear portion of the holder 26. The holder 26 forms a thread 264 at an outer circumferential surface of the rear portion thereof, engaging the holder 26 with the electrical section 30.

The electrical section 30 provides drive power, control circuit and power management for the LEDs 11. The electrical section 30 includes an enclosure 33, a circuit board 31 and a power source 32 in the enclosure 33, and a cover 34 at a rear end of the enclosure 33. An inner diameter of the enclosure 33 is substantially equal to an outer diameter of the rear end of the holder 26. The enclosure 33 engages the holder 26 at a front end thereof. The circuit board 31 is fixed in the front end of the enclosure 33, and the power source 32 is fixed in a rear end of the enclosure 33. In this embodiment, the power source 32 is a battery, and has an electrode 321 at a front end thereof. The power source 32 electrically connects with the circuit board 31 via the electrode 321. The electric wires 114 from the LEDs 11 extend successively through the through holes 241 of the heat sink 24 and the through holes 266 of the holder 26, electrically connecting the LEDs 11 with the circuit board 31. The cover 34 is cylindrical, and forms a thread 343 at an outer circumferential surface of a front portion thereof, engaging the cover 34 with the enclosure 30. The cover 34 has a spring 341 at a center of a front end thereof, and a switch 342 at a center of a rear end thereof. The spring 341 enables the cover 34 to abut the power source 32. The switch 342 controls operation of the LED illumination device 100.

In the LED illumination device 100, heat pipe technology, especially L-shaped heat pipes 23, is utilized to effectively remove the heat generated by the LEDs 11. The heat of the LEDs 11 is firstly transferred to the mounting seat 25. The heat received by the mounting seat 25 is absorbed by the evaporation sections 232 of the heat pipes 23, and then transferred to the heat sink 24 via the condensation sections 231 of the heat pipes 23. The heat is finally and effectively dissipated by the heat sink 24.

Figure 5:
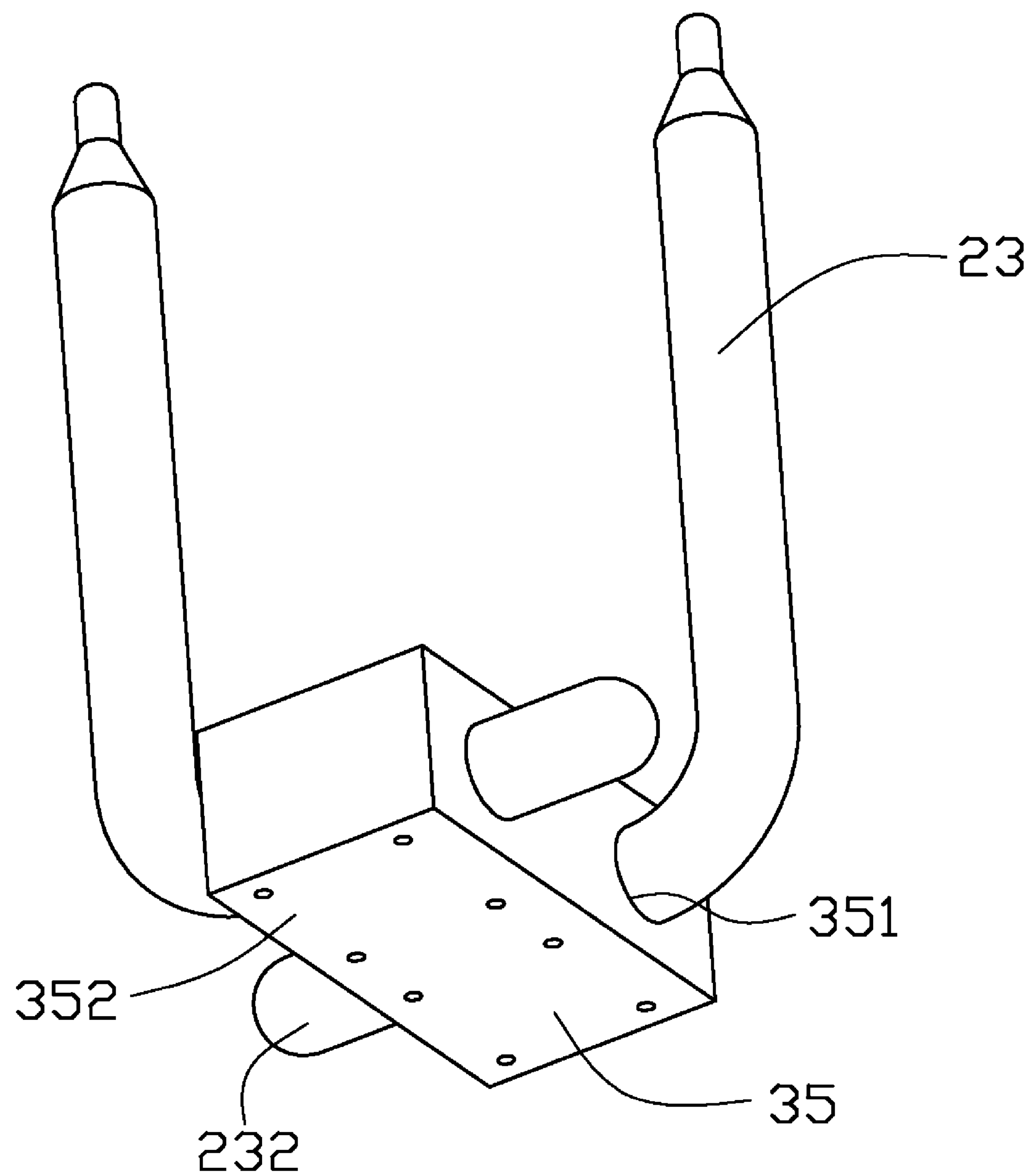
FIG. 5 is an isometric view of a light engine of an LED illumination device in accordance with a second embodiment of the disclosure.

Referring to FIG. 5, the heat pipes 23 and the mounting seat 35 of the light engine of the LED illumination device in accordance with a second embodiment of the disclosure is shown, differing from the first embodiment only in that the mounting seat 35 defines two circular through holes 351 in a middle thereof. A diameter of each through hole 351 is equal to a diameter of the evaporation section 232 of each heat pipe 23, to thereby increase contact surfaces between the heat pipes 23 and the mounting seat 35.

Figure 6:
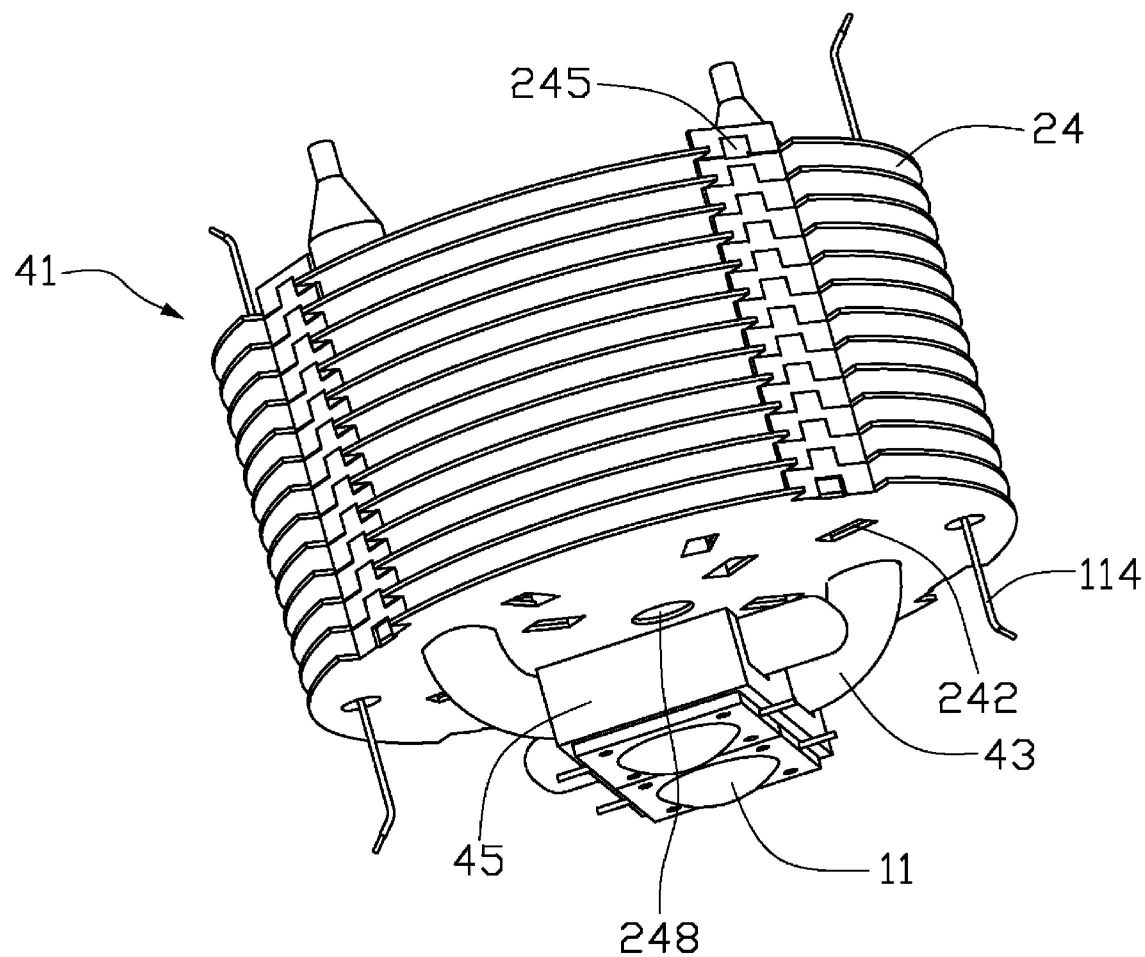
FIG. 6 is an assembled, isometric view of a light engine of an LED illumination device in accordance with a third embodiment of the disclosure.
Figure 7:
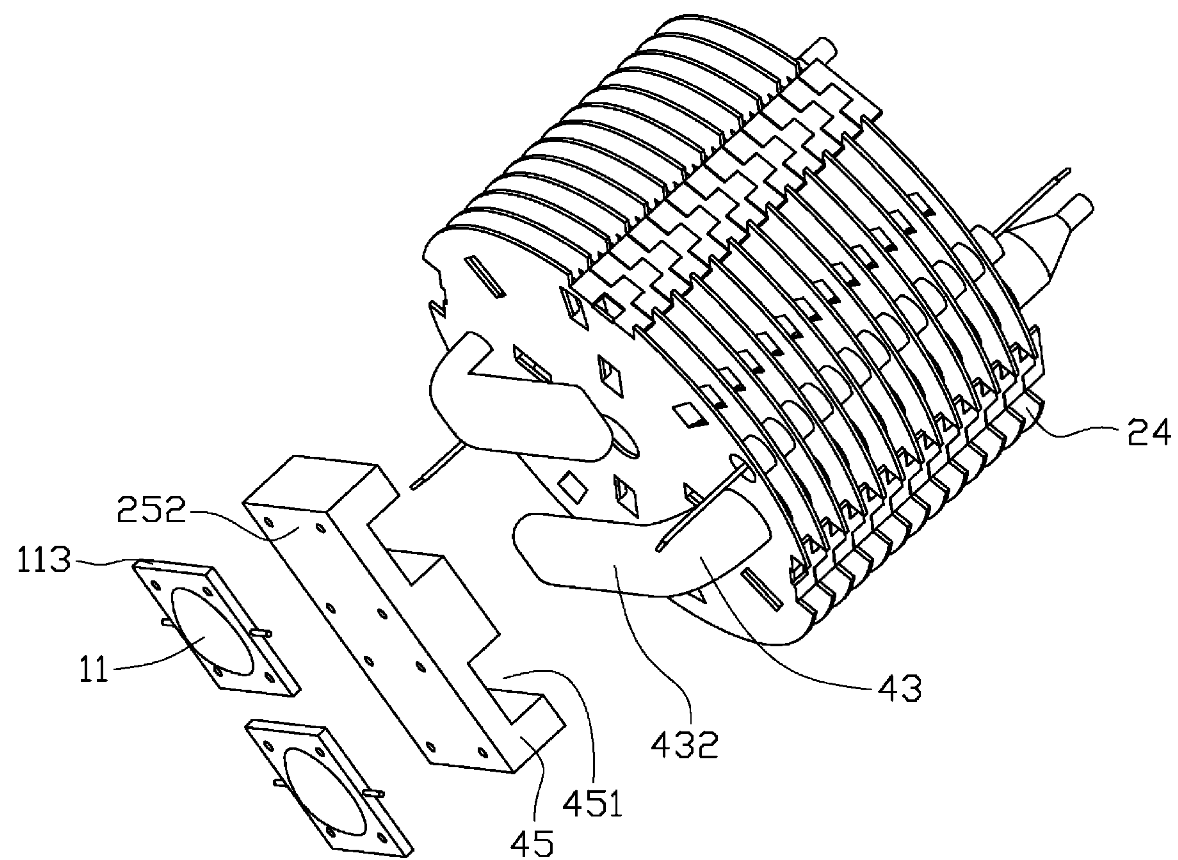
FIG. 7 is an exploded, isometric view of the light engine of FIG. 6.

Referring to FIGS. 6 and 7, the light engine 41 of the LED illumination device in accordance with a third embodiment of the disclosure is shown, differing from the first embodiment only in that the evaporation sections 432 of the heat pipes 43 are flat, and the grooves 451 in the mounting seat 45 are rectangular, matching the evaporation sections 432.

Figure 8:
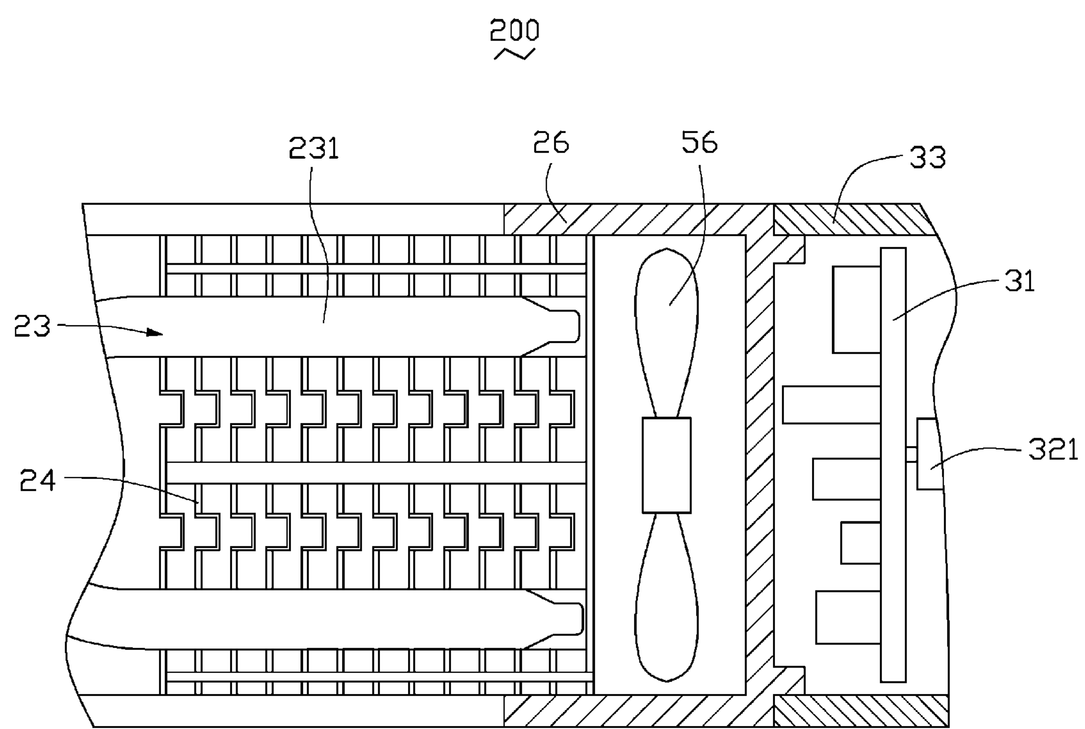
FIG. 8 is a schematic cross-section of an LED illumination device in accordance with a fourth embodiment of the disclosure.

Referring to FIG. 8, the LED illumination device 200 in accordance with a fourth embodiment of the disclosure is shown, differing from the first embodiment only in that the LED illumination device 200 further includes a cooling fan 56 between the heat sink 24 and the holder 26. The cooling fan 56 is an ultrathin mini-fan with low speed. The cooling fan 56 is mounted on the holder 26, and generates airflow towards the heat sink 24, to thereby dissipate heat therefrom. The free end of the condensation section 231 of each heat pipe 23 is embedded in the heat sink 24, and does not extend out of the heat sink 24.

Figure 9:
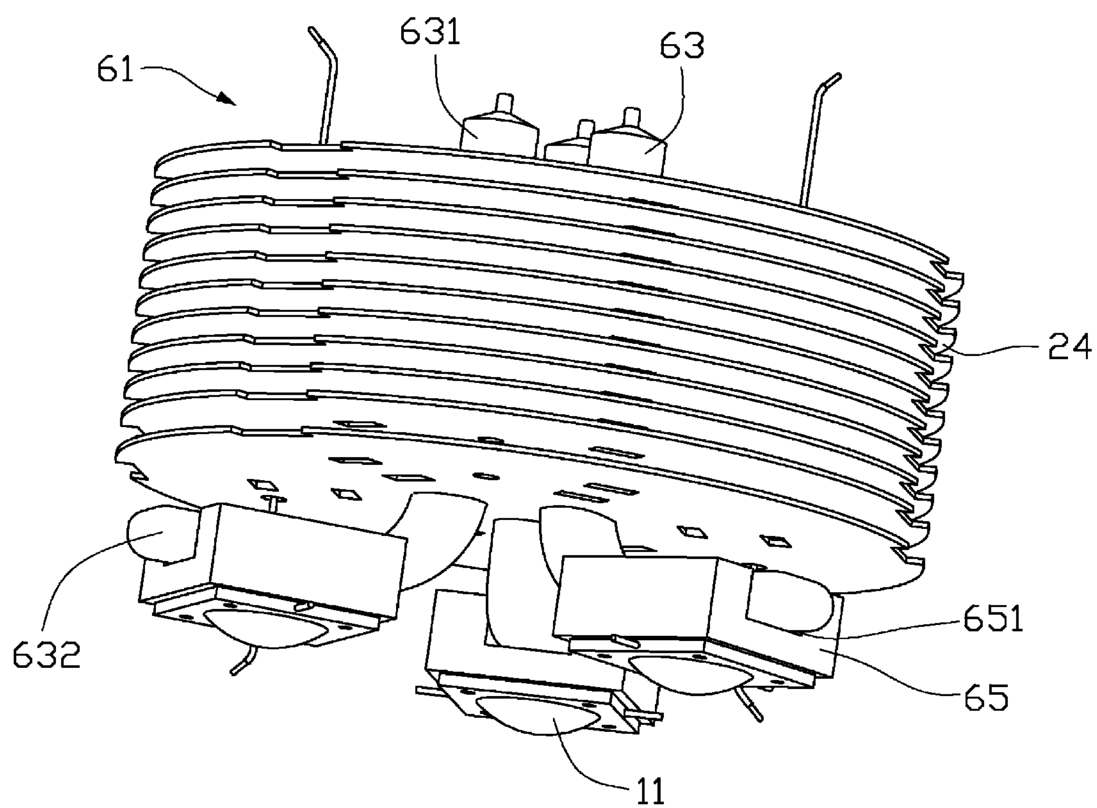
FIG. 9 is an assembled, isometric view of a light engine of an LED illumination device in accordance with a fifth embodiment of the disclosure.

Referring to FIG. 9, the light engine 61 of the LED illumination device in accordance with a fifth embodiment of the disclosure is shown, differing from the third embodiment in FIGS. 6 and 7 only in that the light engine 61 includes three heat pipes 63 and three mounting seats 65. Each of the mounting seats 65 is saddle-shaped, and defines only one groove 651 therein. Each of the heat pipes 63 has the same structure as the heat pipe 23 in the FIGS. 6 and 7, and includes an evaporation section 632 received in the groove 651 of each mounting seat 65, and a condensation section 631 inserted into the heat sink 24. The condensation sections 631 of the heat pipes 63 are parallel, and the evaporation sections 632 of the heat pipes 63 extend radially and outwardly. The LEDs 11 on the mounting seats 65 cooperatively form an equilateral triangle. Alternatively, the mounting seats 65 can be formed integrally as a single piece.

Figure 10:
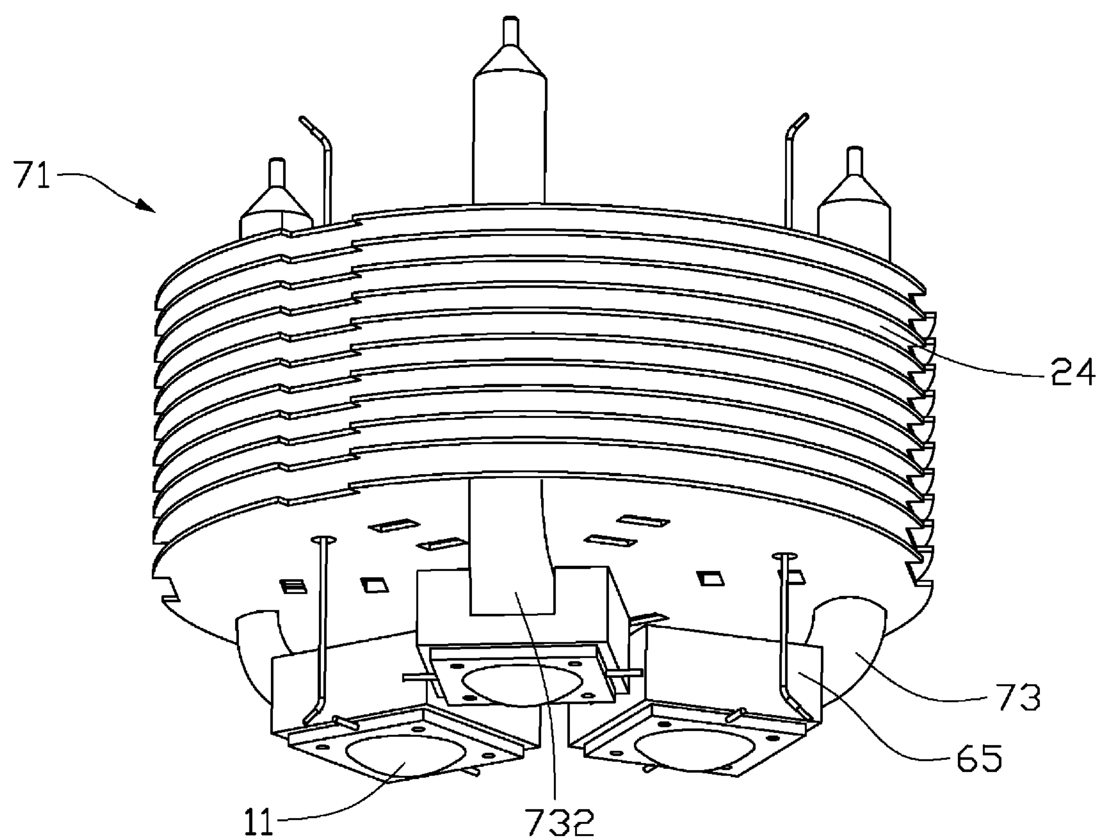
FIG. 10 is an assembled, isometric view of a light engine of an LED illumination device in accordance with a sixth embodiment of the disclosure.

Referring to FIG. 10, the light engine 71 of the LED illumination device in accordance with a sixth embodiment of the disclosure is shown, differing from the fifth embodiment in FIG. 9 only in that the evaporation sections 732 of the heat pipes 73 extend radially and inwardly.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED illumination device, comprising:

an optical section at a front end thereof, comprising at least one LED and a light output housing therearound;

an electrical section at a rear end of the LED illumination device, electrically connecting with the at least one LED; and a heat dissipation section between the optical section and the electrical section comprising:

at least one L-shaped heat pipe comprising an evaporation section and a condensation section substantially perpendicular to the evaporation section;

a heat sink receiving the condensation sections of the at least one heat pipe; and at least one mounting seat attaching to the evaporation section of the at least one heat pipe, the at least one LED thermally connecting with the evaporation section of the at least one heat pipe via the at least one mounting seat;

wherein the heat dissipation section further comprises a frame supporting the heat sink, and a holder mechanically connecting the heat dissipation section with the electrical section, the frame comprising a base and a plurality of arms extending backwardly and axially therefrom, wherein the arms are fixed on the holder, and the at least one heat pipe, the heat sink and the at least one mounting seat are received in a space cooperatively defined by the base, the arms and the holder; and wherein the heat sink defines a plurality of latching grooves at an outer circumferential surface thereof, wherein the arms are inserted into the latching grooves, respectively.

2. The LED illumination device of claim 1, wherein the at least one mounting seat defines at least one groove receiving the evaporation section of the at least one heat pipe therein, and the at least one LED attaches to a front surface of the at least one mounting seat.

3. The LED illumination device of claim 2, wherein the at least one groove is defined in the at least one mounting seat or at a rear surface of the at least one mounting seat.

4. The LED illumination device of claim 2, wherein the at least one groove is rectangular, the evaporation section is straight and flat, and an outer surface of the evaporation section intimately contacts an inner surface of the at least one mounting seat surrounding the groove.

5. The LED illumination device of claim 2, wherein the evaporation section is circular or semicircular, and the at least one groove conformally matches the evaporation section.

6. The LED illumination device of claim 1, wherein the heat dissipation section comprises a plurality of L-shaped heat pipes, each comprising an evaporation section and a condensation section extending backwardly therefrom, wherein the condensation sections of the heat pipes are parallel, and the evaporation sections of the heat pipes extend radially and outwardly.

7. The LED illumination device of claim 1, wherein the heat dissipation section comprises a plurality of L-shaped heat pipes, each comprising an evaporation section and a condensation section extending backwardly from the evaporation section, wherein the condensation sections of the heat pipes are parallel, and the evaporation sections of the heat pipes extend radially and inwardly.

8. The LED illumination device of claim 1, wherein the heat sink defines a plurality of through holes therein, the holder also defines a plurality of through holes therein, and a plurality of electric wires extends from the at least one LED through the through holes of the heat sink and the holder, electrically connecting the at least one LED with the electrical section.

9. The LED illumination device of claim 1, wherein the light output housing comprises a light reflector and a shell enclosing the light reflector, the electrical section comprises an enclosure and a circuit board in the enclosure, and the holder and the base of the heat dissipation section engage the enclosure of the electrical section and the shell of the light output housing, respectively.

10. The LED illumination device of claim 9, wherein the electrical section further comprises a power source in the enclosure, and a cover engaging a rear end of the enclosure away from the holder, the cover comprising a spring at a front end thereof, enabling the cover to intimately abut the power source.

11. The LED illumination device of claim 1, further comprising a cooling fan between the heat sink and the holder, mounted on the holder and generating airflow towards the heat sink.

12. The LED illumination device of claim 11, wherein the heat sink defines a central air channel in a center thereof, and a plurality of vents around the central air channel, the central air channel area exceeding that of each vent.

13. An LED illumination device, comprising:

an optical section at a front end thereof, comprising at least one LED and a light output housing therearound;

an electrical section at a rear end of the LED illumination device, electrically connecting with the at least one LED; and a heat dissipation section between the optical section and the electrical section comprising:

at least one L-shaped heat pipe comprising an evaporation section and a condensation section substantially perpendicular to the evaporation section;

a heat sink receiving the condensation sections of the at least one heat pipe; and at least one mounting seat attaching to the evaporation section of the at least one heat pipe, the at least one LED thermally connecting with the evaporation section of the at least one heat pipe via the at least one mounting seat;

wherein the heat dissipation section further comprises a frame supporting the heat sink, and a holder mechanically connecting the heat dissipation section with the electrical section, the frame comprising a base and a plurality of arms extending backwardly and axially therefrom, wherein the arms are fixed on the holder, and the at least one heat pipe, the heat sink and the at least one mounting seat are received in a space cooperatively defined by the base, the arms and the holder; and wherein the heat sink defines a plurality of through holes therein, the holder also defines a plurality of through holes therein, and a plurality of electric wires extends from the at least one LED through the through holes of the heat sink and the holder, electrically connecting the at least one LED with the electrical section.

14. The LED illumination device of claim 13, wherein the at least one mounting seat defines at least one groove receiving the evaporation section of the at least one heat pipe therein, and the at least one LED attaches to a front surface of the at least one mounting seat.

15. The LED illumination device of claim 13, wherein the heat dissipation section comprises a plurality of L-shaped heat pipes, each comprising an evaporation section and a condensation section extending backwardly therefrom, wherein the condensation sections of the heat pipes are parallel, and the evaporation sections of the heat pipes extend radially and outwardly.

16. The LED illumination device of claim 13, wherein the heat dissipation section comprises a plurality of L-shaped heat pipes, each comprising an evaporation section and a condensation section extending backwardly from the evaporation section, wherein the condensation sections of the heat pipes are parallel, and the evaporation sections of the heat pipes extend radially and inwardly.

17. The LED illumination device of claim 13, wherein the light output housing comprises a light reflector and a shell enclosing the light reflector, the electrical section comprises an enclosure and a circuit board in the enclosure, and the holder and the base of the heat dissipation section engage the enclosure of the electrical section and the shell of the light output housing, respectively.

18. The LED illumination device of claim 13, further comprising a cooling fan between the heat sink and the holder, mounted on the holder and generating airflow towards the heat sink.

19. An LED illumination device, comprising:

an optical section at a front end thereof, comprising at least one LED and a light output housing therearound;

an electrical section at a rear end of the LED illumination device, electrically connecting with the at least one LED; and a heat dissipation section between the optical section and the electrical section comprising:

at least one L-shaped heat pipe comprising an evaporation section and a condensation section substantially perpendicular to the evaporation section;

a heat sink receiving the condensation sections of the at least one heat pipe; and at least one mounting seat attaching to the evaporation section of the at least one heat pipe, the at least one LED thermally connecting with the evaporation section of the at least one heat pipe via the at least one mounting seat;

wherein the heat dissipation section further comprises a frame supporting the heat sink, and a holder mechanically connecting the heat dissipation section with the electrical section, the frame comprising a base and a plurality of arms extending backwardly and axially therefrom, wherein the arms are fixed on the holder, and the at least one heat pipe, the heat sink and the at least one mounting seat are received in a space cooperatively defined by the base, the arms and the holder; and a cooling fan between the heat sink and the holder, mounted on the holder and generating airflow towards the heat sink.

20. The LED illumination device of claim 19, wherein the heat sink defines a central air channel in a center thereof, and a plurality of vents around the central air channel, the central air channel area exceeding that of each vent.

* * * * *